(12) United States Patent
Bardin

(10) Patent No.: US 11,929,711 B2
(45) Date of Patent: Mar. 12, 2024

(54) QUBIT CONTROL ELECTRONICS

(71) Applicant: Google LLC, Mountain View, CA (US)

(72) Inventor: Joseph Cheney Bardin, Amherst, MA (US)

(73) Assignee: Google LLC, Mountain View, CA (US)

( * ) Notice: Subject to any disclaimer, the term of this patent is extended or adjusted under 35 U.S.C. 154(b) by 630 days.

(21) Appl. No.: 17/251,370

(22) PCT Filed: Feb. 19, 2019

(86) PCT No.: PCT/US2019/018584
§ 371 (c)(1),
(2) Date: Dec. 11, 2020

(87) PCT Pub. No.: WO2020/055450
PCT Pub. Date: Mar. 19, 2020

(65) Prior Publication Data
US 2021/0257969 A1 Aug. 19, 2021

Related U.S. Application Data

(60) Provisional application No. 62/729,316, filed on Sep. 10, 2018.

(51) Int. Cl.
*H03D 7/00* (2006.01)
*B82Y 10/00* (2011.01)
(Continued)

(52) U.S. Cl.
CPC .............. *H03D 7/005* (2013.01); *B82Y 10/00* (2013.01); *G06F 1/20* (2013.01); *G06N 10/00* (2019.01);
(Continued)

(58) Field of Classification Search
CPC .... H03D 7/005; H03D 7/1458; H03D 7/1466; B82Y 10/00; G06F 1/20; G06N 10/00;
(Continued)

(56) References Cited

U.S. PATENT DOCUMENTS 8,111,083 B1 * 2/2012 Pesetski ................. G06N 10/00
327/528
8,461,862 B2 * 6/2013 Pesetski ................... H03K 3/38
257/14
(Continued)

FOREIGN PATENT DOCUMENTS

JP 200749009 2/2007
JP 2011523747 8/2011
WO WO 2017/139683 8/2017

OTHER PUBLICATIONS

Office Action in Canadian Appln. No. 3,101,170, dated Apr. 7, 2022, 5 pages.
(Continued)

*Primary Examiner* — Ramesh B Patel
(74) *Attorney, Agent, or Firm* — Fish & Richardson P.C.

(57) ABSTRACT

A device for generating a qubit control signal includes: a first signal envelope generator circuit including a first multiple of signal sources, in which an output of each signal source of the first multiple of signal sources is combined to provide a first cumulative output; and a first mixer circuit coupled to the first signal envelope generator circuit, in which the first cumulative output is coupled to a first input of the first mixer circuit, and an output of the first mixer circuit includes a first qubit control signal.

26 Claims, 13 Drawing Sheets

(51) Int. Cl.
*G06F 1/20* (2006.01)
*G06N 10/00* (2022.01)
*H03D 7/14* (2006.01)
*H01F 6/00* (2006.01)
*H02M 1/08* (2006.01)
*H03K 3/38* (2006.01)
*H03K 17/693* (2006.01)
*H03K 17/92* (2006.01)
*H03K 19/195* (2006.01)
*H03M 1/12* (2006.01)
*H04B 10/077* (2013.01)
*H04B 10/70* (2013.01)

(52) U.S. Cl.
CPC ......... *H03D 7/1458* (2013.01); *H03D 7/1466* (2013.01); *H01F 6/00* (2013.01); *H02M 1/08* (2013.01); *H03K 3/38* (2013.01); *H03K 17/693* (2013.01); *H03K 17/92* (2013.01); *H03K 19/195* (2013.01); *H03M 1/12* (2013.01); *H04B 10/077* (2013.01); *H04B 10/70* (2013.01)

(58) Field of Classification Search
CPC .. H01F 6/00; H02M 1/08; H03K 3/38; H03K 17/693; H03K 17/92; H03K 19/195; H03M 1/12; H04B 10/077; H04B 10/70
See application file for complete search history.

(56) References Cited

U.S. PATENT DOCUMENTS

| | | | | |
|---|---|---|---|---|
| 10,063,228 | B2* | 8/2018 | Deurloo | H03K 17/92 |
| 10,528,885 | B2* | 1/2020 | Chow | G06F 1/10 |
| 11,218,228 | B2* | 1/2022 | Figueroa | H04B 10/077 |
| 11,443,222 | B2* | 9/2022 | Chow | G06F 1/08 |
| 11,683,026 | B1* | 6/2023 | Chakraborty | G06N 10/40 |
| | | | | 327/527 |
| 11,777,496 | B1* | 10/2023 | Chakraborty | H03D 7/1425 |
| | | | | 327/291 |
| 2012/0144159 | A1* | 6/2012 | Pesetski | H03K 17/92 |
| | | | | 712/36 |
| 2018/0013426 | A1* | 1/2018 | Deurloo | G06N 10/00 |
| 2018/0225586 | A1 | 8/2018 | Chow et al. | |
| 2019/0392344 | A1* | 12/2019 | Kelly | H03K 3/38 |
| 2020/0065696 | A1* | 2/2020 | Chow | G06N 10/00 |
| 2021/0028865 | A1* | 1/2021 | Figueroa | H04B 10/70 |
| 2021/0257969 | A1* | 8/2021 | Bardin | G06N 10/00 |
| 2023/0208402 | A1* | 6/2023 | Chakraborty | H03M 1/742 |
| | | | | 327/527 |

OTHER PUBLICATIONS

Office Action in Japanese Appln. No. 2020-566828, dated Mar. 22, 2022, 6 pages.
Patra et al., "Cryo-CMOS Circuits and Systems for Quantum Computing Applications," IEEE Journal of Solid-State Circuits, Jan. 2018, 53(1):309-321.
Barends et al., "Superconducting quantum circuits at the surface code threshold for fault tolerance," Nature, Apr. 2014, 508:500-503 pages.
Beckers et al., "Characterization and Modeling of 28-nm Bulk CMOS Technology Down to 4.2 K," IEEE J. Elec. Dev. Soc., 2018, 6:1-11 pages.
Charbon et al., "Cryo-CMOS circuits and systems for scalable quantum computing," ISSCC Dig. Tech Papers, Feb. 2017, 264-265 pages.
Das et al., "SOS current mirror matching at 4K: A brief study," Proc. ISCAS, 2010, 3405-3408 pages.
Fowler et al. "Surface codes: Towards practical large-scale quantum computation," Phys. Rev. A, Sep. 2012, 86:1-48 pages.
Korotkov, "Double-balanced mixer based on Mosfets, " Russian Microelectronics, Mar. 2011, 40:128-140 pages.
Lamb et al., "An FPGA-based instrumentation platform for use at deep cryogenic temperatures, " Review of Scientific Instruments, Jan. 2016, 87:1-8 pages.
Patra et al., "Cryo-CMOS Circuits and Systems for Quantum Computing Applications," IEEE Journal of Solid-State Circuits, Jan. 2018, 53:1-13 pages.
PCT International Search Report and Written Opinion in International Appln. No. PCT/US2019/018584, dated Mar. 6, 2019, 15 pages.
Rahman, "Cryogenic Electronics for Quantum Computer Interface: Low Temperature D/A Converters for Silicon Quantum Computer Controller Circuit," Mar. 2016, 1-167 pages.
Reilly, "Engineering the quantum-classical interface of solid-state qubits," npj Quant. Inform., Oct. 2015, 1:1-10 pages.
Office Action in European Appln. No. 19709240.6, dated May 19, 2023, 12 pages.
Decision to Grant Patent in Japanese Appln. No. 2020-566828, dated Oct. 17, 2022, 5 pages (with English translation).
PCT Preliminary Report on Patentability in International Appln. No. PCT/US2019/018584, dated Mar. 25, 2021, 14 pages.
Office Action in Canadian Appln. No. 3,101,170, dated Aug. 18, 2023, 5 pages.

* cited by examiner

QUBIT CONTROL ELECTRONICS

CROSS-REFERENCE TO RELATED APPLICATION

This application is a National Stage Application under 35 U.S.C. § 371 and claims the benefit of International Application No. PCT/US2019/018584, filed on Feb. 19, 2019, which claims priority to U.S. Provisional Application Ser. No. 62/729,316, filed on Sep. 10, 2018. The disclosure of the prior applications are considered part of and are incorporated by reference in the disclosure of this application.

TECHNICAL FIELD

This present disclosure relates to qubit control electronics.

BACKGROUND

Classical computers have memories made up of bits, where each bit can represent either a zero or a one. Quantum computers maintain sequences of quantum bits, called qubits, where each quantum bit can represent a zero, a one, or any quantum superposition of zeros and ones. Quantum computers operate by setting qubits in an initial state and controlling the qubits, e.g., according to a sequence of quantum logic gates. A calculation may include collapsing the system of qubits into an eigenstate where each qubit represents either a zero or one. Measurements may be made both during and at the end of a calculation. For instance, in a quantum error correction algorithm, measurements are made each cycle to detect errors. In addition, measurements are often carried out on a subset of the qubits as opposed to the entire array.

SUMMARY

The qubit control electronics of the present disclosure may be embodied in an integrated circuit (IC) that includes CMOS integrated circuit elements. The IC may be operated in a low temperature environment such as an intermediate cooling stage (e.g., between about 3-4 K) of a cryostat between room temperature and the operating temperature of the superconducting qubits. The qubit control electronics, which may be embodied in the IC, generate qubit control signals, such as qubit XY control signals, using an envelope generator circuit that is electrically coupled to a mixer circuit. The signal envelope generator circuit generates a signal envelope, and includes multiple individual signal sources (e.g., current sources), which may be programmable. In certain implementations, the envelope generator circuit cumulatively sums the outputs from the multiple individual signal sources and provides the summed output to a first mixer circuit of a vector modulator circuit. The first mixer circuit may include, e.g., a double balanced mixer circuit, for up-conversion of the summed output of the envelope generator circuit. The first mixer circuit mixes a summed output from the signal envelope generator circuit with a local oscillator signal to provide the qubit control signal. In some implementations, the qubit control electronics include a second envelope generator circuit coupled to a second mixer circuit of the vector modulator circuit, in which the second envelope generator circuit is constructed in the same manner as the first envelope generator circuit. The output of the second mixer circuit may be combined with the output of the first mixer circuit to provide the qubit control signal.

The qubit control electronics disclosed herein may have various advantages. For example, in some implementations, the qubit control electronics disclosed herein may be used to reduce the cabling requirements of a quantum computing system. The qubit control electronics may also reduce power consumption of a quantum computing system. The qubit control electronics of the present disclosure may be used without adversely affecting error rates while consuming of the order of 1 mW/qubit or less, such that cryogenic cooling of the qubit control electronics is feasible. By enabling operation of the qubit control electronics at cryogenic temperatures, power consumption may be reduced even further by allowing the use of lossless superconducting interconnects, rather than room-temperature interconnects, to transfer data between the qubit control electronics and the device on which the qubits are formed.

In general, in certain aspects, the subject matter of the present disclosure may be embodied in a device for generating a qubit control signal, in which the device includes: a first signal envelope generator circuit including a first multiple of signal sources, in which an output of each signal source of the first multiple of signal sources is combined to provide a first cumulative output; and a first mixer circuit coupled to the first signal envelope generator circuit, in which the first cumulative output is coupled to a first input of the first mixer circuit, and an output of the first mixer circuit includes a first qubit control signal.

Implementations of the device may include one or more of the following features. For example, in some implementations, the first multiple of signal sources includes a multiple of current sources. The multiple current sources may include programmable current sources. The output of each current source may be tied to a common node.

In some implementations, the first signal envelope generator circuit includes a variable capacitor coupled to the first cumulative output.

In some implementations, the first signal envelope generator circuit includes a delay circuit coupled to the first multiple of signal sources. The delay circuit may include multiple flip-flops configured to cause sequential activation and deactivation of the first plurality of signal sources.

In some implementations, the first mixer circuit includes a double balanced mixer circuit. The double balanced mixer circuit may include multiple MOSFETS.

In some implementations, the first mixer circuit is configured to mix the first cumulative output with a local oscillator signal received at a second input of the first mixer circuit.

In some implementations, the device includes memory. The device may include a multiplexer array coupled to the memory and to the first signal envelope generator circuit.

In some implementations, the device further includes: a second signal envelope generator circuit including a second multiple of signal sources, in which an output of each signal source of the second multiple of signal sources is combined to provide a second cumulative output; and a second mixer circuit, in which the second cumulative output is coupled to a first input of the second mixer circuit, an output of the second mixer circuit includes a second qubit control signal, and the first qubit control signal is combined with the second qubit control signal to provide a qubit XY control signal. The first mixer circuit may be configured to mix the first cumulative output with a first local oscillator signal received at a second input of the first mixer circuit and the second mixer circuit may be configured to mix the second cumulative output with a second local oscillator signal received at a second input of the second mixer circuit. The first local oscillator signal may be out of phase with the second local oscillator signal. For example, the first local oscillator signal may be out of phase with the second local oscillator signal by any one of 90°, 180°, or 270°.

In some implementations, the device is an integrated circuit chip.

In general, in another aspect, the subject matter of the present disclosure may be embodied in a quantum computing system that includes: a cooling device capable of providing multiple cooling stages, in which each cooling stage is maintained at a different temperature; a qubit chip including a qubit, in which the qubit chip is arranged in the cooling device and maintained at a first cooling stage, in which a temperature of the first cooling stage is between 0 K and 100 mK; and a control circuit for generating a qubit XY control signal arranged in the cooling device and maintained at a second cooling stage, in which a temperature of the second cooling stage is above the temperature of the first cooling stage and below room temperature, and in which the control circuit is coupled to qubit chip. The control circuit for generating the qubit XY control may include any of the qubit control signal generating devices described above.

In general, in another aspect, the subject matter of the present disclosure may be embodied in methods for generating a qubit control signal, the methods including: sequentially activating a first multiple of signal sources; combining an output of the sequentially activated first multiple of signal sources to provide a first combined output; passing the first combined output to a first mixer circuit; and mixing the first combined output with a local oscillator signal in the first mixer circuit to provide a first qubit control signal.

Implementations of the methods may include one or more of the following features. For example, in some implementations, the first multiple of signal sources includes a first multiple of current sources. The first multiple of current sources may be programmable current sources.

In some implementations, the methods include sequentially deactivating the first multiple of signal sources. The first combined output may include a combined output of the sequentially deactivated first multiple of signal sources.

In some implementations, the methods further include smoothing the first combined output prior to passing the first combined output to the first mixer circuit.

In some implementations, the methods further include: sequentially activating a second multiple of signal sources; combining an output of the sequentially activated second multiple of signal sources to provide a second combined output; passing the second combined output to a second mixer circuit; mixing the second combined output with a second local oscillator signal in the second mixer circuit to provide a second qubit control signal; and combining the first qubit control signal with the second qubit control signal to provide a qubit XY control signal. The first local oscillator signal may be out of phase with the second local oscillator signal.

In some implementations, methods are performed in an environment where the temperature is above 1 mK and below 40 K.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
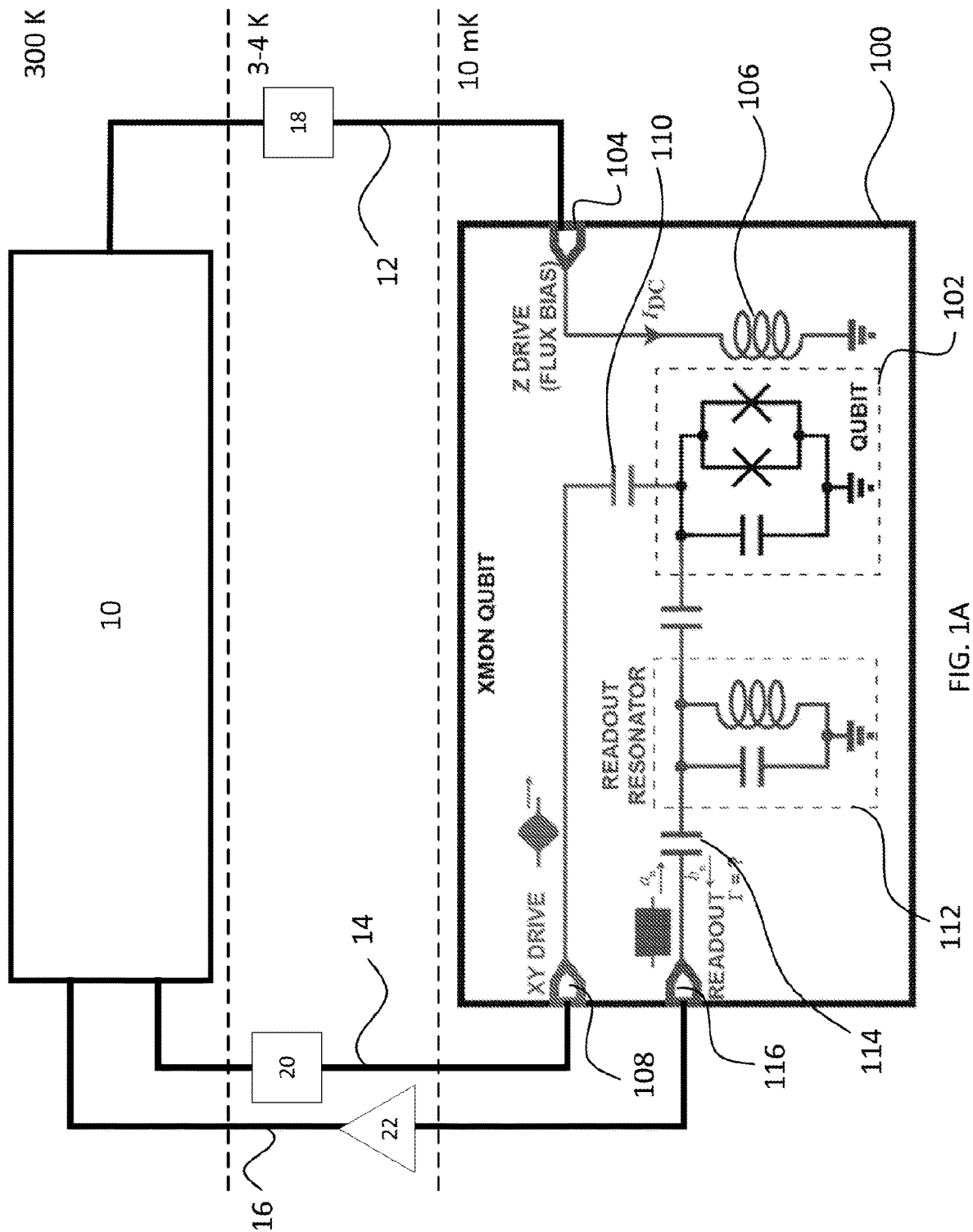
FIG. 1A is a schematic diagram that illustrates an example of a single qubit quantum computing system.

Quantum computing entails coherently processing quantum information stored in the quantum bits (qubits) of a quantum computer. Superconducting quantum computing is a promising implementation of solid-state quantum computing technology in which quantum information processing systems are formed, in part, from superconducting materials. To operate quantum information processing systems that employ solid-state quantum computing technology, such as superconducting qubits, the systems are maintained at extremely low temperatures, e.g., in the 10s of mK. The extreme cooling of the systems keeps superconducting materials below their critical temperature and helps avoid unwanted state transitions. To maintain such low temperatures, the quantum information processing systems may be operated within a cryostat, such as a dilution refrigerator. In some implementations, control signals are generated in higher-temperature environments, and are transmitted to the quantum information processing system using shielded impedance-controlled GHz capable transmission lines, such as coaxial cables. The cryostat may step down from room-temperature (e.g., about 300 K) to the operating temperature of the qubits in one or more intermediate cooling stages. For instance, the cryostat may employ a first stage maintained at a first temperature range T1 that is colder than room temperature stage by one or two orders of magnitude, e.g., about 30-40 K or about 3-4 K, and warmer than the operating temperature for the qubits (e.g., about 10 mK or less or about 100 mK or less).

Even at the extremely low qubit operating temperatures, qubits may still suffer from decoherence and gate errors. As such, large-scale quantum error correction algorithms can be deployed to compensate for the gate errors and qubit decoherence. An error-corrected quantum processor leverages redundancy to synthesize protected logical qubits from ensembles of error-prone qubits. While the required degree of redundancy depends on the error rates of the constituent qubits, in certain implementations, it is expected that at least 1,000 physical qubits may be required to realize a single error-corrected logical qubit. Implementations of current superconducting quantum systems use, e.g., at least two room-temperature co-axial cables per qubit to provide the qubit control signal. Moreover, to solve complex problems using a quantum computer, it is expected that upwards of 1,000 or more error-corrected logical qubits may be necessary. Using present systems, such scaling may require millions of separate cables. Additionally, such a system would require significant power consumption to generate the control signals that drive the qubits of the quantum processor.

The present disclosure is directed to qubit control electronics that may be used to reduce the cabling requirements of a quantum computing system, and that may also reduce power consumption of a quantum computing system. The qubit control electronics of the present disclosure may be used without adversely affecting error rates while consuming of the order of 1 mW/qubit or less, such that cryogenic cooling of the qubit control electronics is feasible. By enabling operation of the qubit control electronics at cryogenic temperatures, power consumption may be reduced even further as lossless superconducting interconnects, rather than room-temperature interconnects, may be used to transfer data between the qubit control electronics and the device on which the qubits are formed. In addition, the on-chip waveform memory provides a means to greatly reduce the amount of data transfer required to produce the band-limited XY control signals.

The qubit control electronics of the present disclosure may be embodied in an integrated circuit (IC) that includes, e.g., CMOS integrated circuit elements on a flat (an in some implementations, monolithic) piece or chip of semiconductor material, such as silicon. The IC may be operated in a low temperature environment such as an intermediate cooling stage (e.g., between about 3-4 K) of a cryostat between room temperature and the operating temperature of the superconducting qubits. The qubit control electronics, which may be embodied in the IC, generate qubit control signals using a first signal envelope generator circuit that is electrically coupled to a first mixer circuit. The signal envelope generator circuit generates a signal envelope, and includes multiple individual signal sources (e.g., current sources), which may be programmable. In certain implementations, the envelope generator circuit cumulatively sums the outputs from the multiple individual signal sources and provides the summed output to the first mixer circuit. The first circuit mixer circuit may include, e.g., a double balanced mixer circuit element, for up-conversion of the summed output of the envelope generator circuit. The first mixer circuit mixes a summed output from the first signal envelope generator circuit with a local oscillator signal to provide the qubit control signal. In some implementations, the qubit control electronics include a second signal envelope generator circuit coupled to a second mixer circuit, in which the second signal envelope generator circuit is constructed in the same manner as the first envelope generator circuit. The first and second mixer circuits may form part of a vector modulator circuit. The output of the first mixer circuit may be combined with the output of the second mixer circuit to provide the qubit control signal, such as a qubit XY control signal.

Prior to describing further details of the qubit control electronics, a brief review of a standard quantum computing system including the qubits, the quantum control elements, and quantum measurement is provided.

An ideal qubit is a two level system whose state can be represented as a superposition of its eigenstates, $|\psi\rangle = \cos(\theta/2)|0\rangle + \exp\{j\phi\}\sin(\theta/2)|1\rangle$. Accordingly, the state of a qubit has a unique interpretation as a point on the surface of the Bloch sphere. In a typical quantum algorithm, a sequence of, e.g., single- and/or two-qubit gates is applied to a collection of qubits, after which the states of a subset of these qubits are measured. Single-qubit gates include well-defined rotations on the surface of the Bloch sphere, whereas two-qubit gates are conditioned rotations on the Bloch sphere.

FIG. 1A is a schematic diagram that illustrates a single qubit quantum computing system. The quantum computing system includes a qubit chip 100 coupled to qubit control electronics 10. The qubit chip 100 includes one or more qubits 102, such as superconducting qubits, and may be operated using a cryostat at extremely low temperatures (e.g., at around 10 mK or less, such as 1 mK, subject to the minimum possible temperature achievable by the cryostat). For the purposes of this disclosure, the qubits operated by the qubit control electronics are assumed to be frequency tunable transmon qubits, which have fast gate times (e.g., <15 ns), low single- and two-qubit error rates (e.g., <0.1% and <0.6%, respectively), moderate coherence times (e.g., ~0.1 ms), and monolithic implementation. However, the qubit control electronics described herein are not limited to working with transmon qubits and may also be used with other qubit configurations, such as fluxmon qubits or gmon qubits, among others. Each qubit 102 of the qubit chip 100 may be coupled to a Z-drive qubit circuit element 106 (e.g., a resonator), an XY-drive qubit circuit element 110 (e.g., a capacitor), and a qubit readout resonator 112. The qubits 102 and associated circuit elements formed on the qubit chip 100 can be formed from patterned superconductor materials on a dielectric substrate (e.g., aluminum on a silicon or sapphire substrate).

The qubit chip 100 is coupled to the qubit control electronics 10, which are operated at room temperature (e.g., about 300 K). Data lines that connect the control electronics 10 to the qubit chip 100 may pass through one or more low temperature intermediate stages of the cryostat. For instance, the qubit Z-control lines 12, qubit XY control lines 14, and qubit readout lines 16 may pass through an intermediate stage of the cryostat that is cooled to below room temperature but above the qubit operating temperature, e.g., at around 3-4 K. In some implementations, the control lines may also include attenuators (e.g., attenuator 18, 20) or amplifiers (e.g., amplifier 22). The data lines may be coupled to ports (e.g., ports 104, 108, and 116) on the qubit chip 100.

Figure 1B:
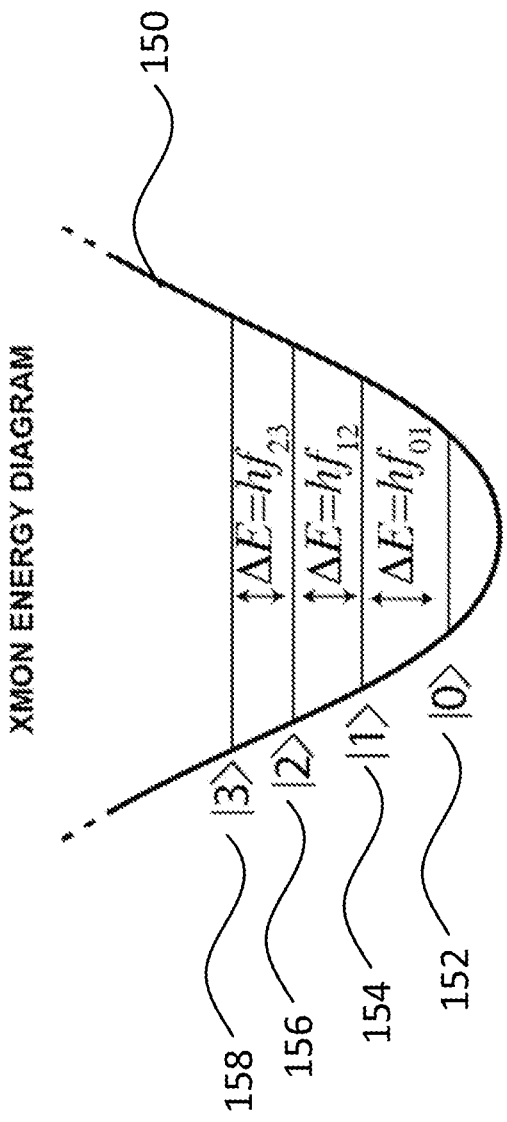
FIG. 1B is an anharmonic energy diagram.

As shown in FIG. 1A, the qubit 102 is a non-linear resonator that includes a capacitor in parallel with a pair of Josephson Junctions (illustrated as X's) wired in a loop to form a squid whose effective inductance can be tuned by threading the loop with an external magnetic flux drive (e.g., provided by the Z-drive line 12). The non-linearity associated with the Josephson junction(s) results in an anharmonic energy diagram 150 as shown in FIG. 1B, in which discrete energy levels (152, 154, 156, 158) are formed. The separation between energy levels may be expressed as $\Delta E = hf_{mn}$, where h is Planck's constant, and $f_{mn}$ is the frequency difference between energy levels m and n. Typical values of $f_{01}$ and $f_{12}-f_{01}$ are 6 GHz and 250 MHz, respectively. As such, it is possible to exclusively address the $|0\rangle$ to $|1\rangle$ transition using a microwave (XY) drive, thereby approximating the desired two-level qubit.

Microwave gate operations on qubits, such as qubits 102, can be carried out by generating an XY control signal at the control electronics 10 and then applying the XY control signal, when the qubit is operating at its resonant frequency, to the XY port 108 of the qubit 102, resulting in a deterministic rotation of the qubit state about an axis in the XY plane of the Bloch sphere, where the axis and angle of rotation are determined by the carrier phase and integrated envelope amplitude of the microwave signal, respectively. The finite coherence time of a qubit makes it desirable to minimize the duration of the applied pulse, but a temporally short pulse contains a broad spectrum of frequencies. Thus, there is a tradeoff between pulse duration and population of the |2> state, as energy in the pulse sideband can couple to the $f_{12}$ transition. As such, the XY pulses employed to drive qubits are typically shaped to minimize leakage to the |2> state, with Gaussian and raised cosine envelopes among the most popular. Exemplary pulse durations and envelope amplitudes, referenced to the XY port 108, are 10-30 ns and 10-100 µV, respectively. The state of the qubit 102 can be sensed through a projective measurement in which the reflection coefficient of the readout resonator 112 is measured, causing the qubit to collapse to the |0> state with probability of $\cos^2(\theta/2)$ and to the |1> state with probability $\sin^2(\theta/2)$. Depending on which state the qubit collapses to, the measured reflection coefficient will take on one of two distinct values.

Standard control circuits 10 operating at room temperature use high-speed (~1 GSPS or higher) and high-resolution (~14-bit) digital to analog converter (DAC) waveform generators to generate each qubit XY control signal. Such high-speed waveform generators consume a substantial amount of power.

Rather than using high-power, high-speed and extremely high resolution DACs, at least a portion of the qubit control circuit 10 can be replaced with control electronics that are capable of generating a wide range of qubit control signals (e.g., qubit XY control signals), use a lower bit resolution, require a lower data rate, and consume less power. Moreover, the integrated circuit can be operated at cryogenic temperatures (e.g., at or below 30-40 K, such as 3-4 K). Accordingly, the co-axial cables that typically couple the control electronics to the qubit chip can be replaced with superconductor connectors that are lossless if the transition temperature of the superconductor is above the operating cryogenic temperature, further reducing the power consumption of the quantum computing system.

Figure 2:
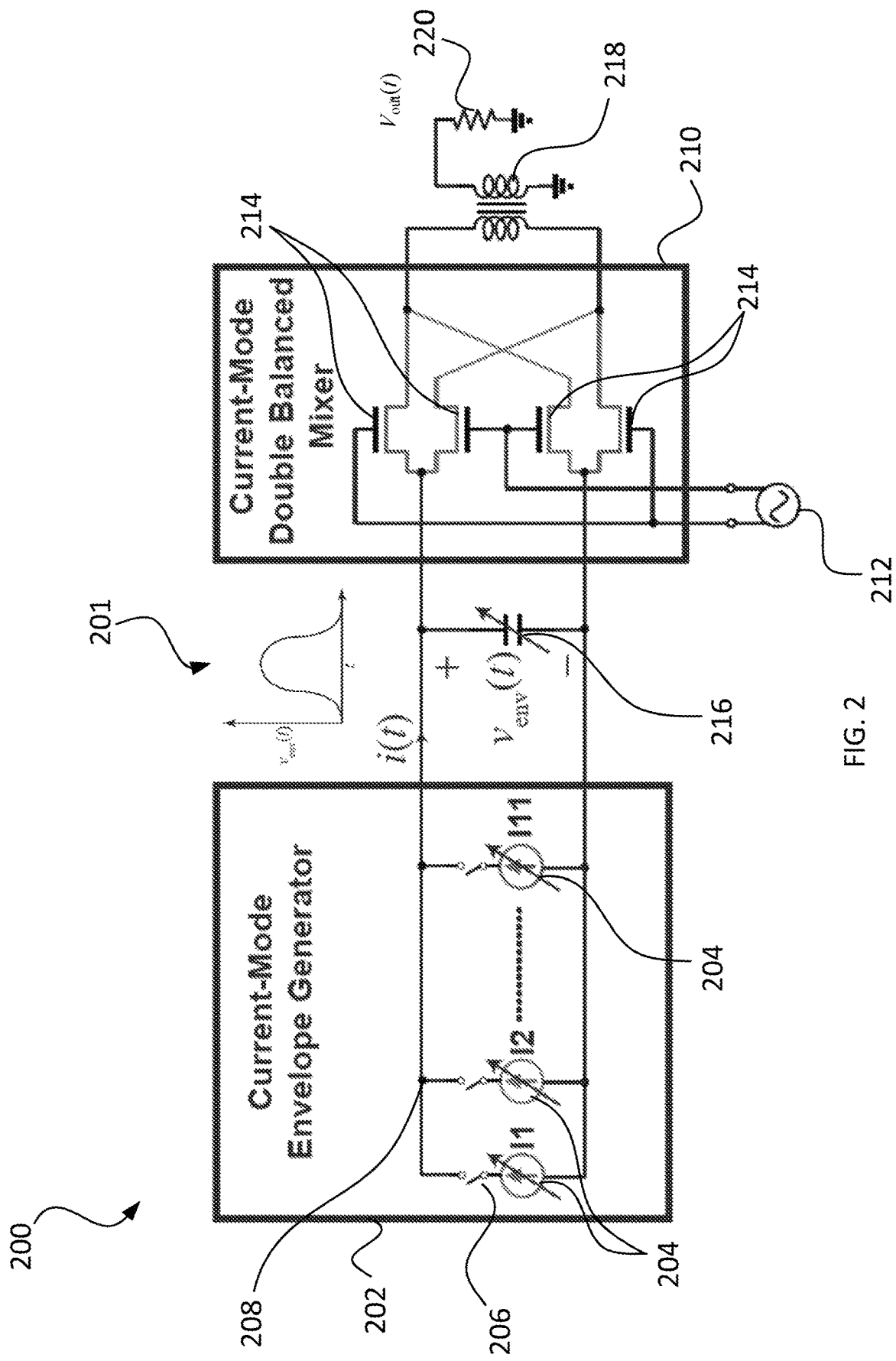
FIG. 2 is a schematic that illustrates an example of a qubit control circuit.

FIG. 2 is a schematic that illustrates an example of a simplified qubit control circuit 200 for generating a qubit control signal, such as a qubit XY control signal. The qubit control circuit 200 can be used in place of at least a portion of the qubit control circuit 10 shown in FIG. 1A. In some implementations, the qubit control circuit 200 can be implemented as an IC, which includes a set of electronic circuits integrated as part of a piece of semiconductor material. In some implementations, the qubit control circuit 200 is operated at cryogenic temperatures (e.g., at or below 30-40 K, such as 3-4 K) instead of at room temperature like the qubit control circuit 10 shown in FIG. 1A.

The qubit control circuit 200 includes a signal envelope generator circuit 202 coupled to a mixer circuit 210. As shown in the example of FIG. 2, the signal envelope generator circuit 202 may include a current-mode envelope generator. The current-mode envelope generator includes multiple different current sources 204. Although eleven current sources 204 are shown in FIG. 2 (with the dotted lines representative of current sources that are not depicted), at least two current sources may be used. The current sources 204 may be programmable such that each current source 204 can be controlled to output a defined current level. In some implementations, the waveforms for each current source 204 are stored in memory of the qubit control circuit 200. The multiple current sources 204 are coupled in parallel, such that the output of each of the current sources 204 is tied to a common output or node 208. When one or more of the current sources 204 are activated, the total current output measured at node 208 is provided as i(t). A switch 206 is provided in series with each current source 204. The switch 206 for each source may be opened or closed to allow the output of the current source to be added or removed from the total current output i(t). Although a switch 206 is shown in FIG. 2 as being used to control whether the output of a current source is combined to the total current output, other control mechanisms can be used instead. Furthermore, although the signal envelope generator 202 is shown in FIG. 2 as using multiple programmable current sources, other signal sources may be used instead. For example, multiple programmable voltage sources may be used in place of current sources. Other circuit elements of the qubit control circuit 200 may be modified accordingly for use with the programmable voltage sources. For instance, voltage sources may combined in series.

In some implementations, the output of the signal envelope circuit is smoothed before being coupled to the mixer circuit 210. For example, smoothing may be achieved by using a variable capacitor 216 placed across the positive and negative output of the signal envelope generator circuit 202. The voltage across the capacitor 216 is provided as $v_{env}(t)$. An example of the envelope signal $v_{env}(t)$ is shown in plot 201 above circuit 200.

The smoothed output of the signal envelope circuit is coupled to the mixer circuit 210. In some implementations, the mixer circuit 210 mixes the output from the signal envelope generator circuit with a local oscillator signal 212. The local oscillator signal 212 is at a carrier frequency. As shown in FIG. 2, the mixer circuit 210 includes a current-mode double balanced mixer circuit. The double balanced mixer circuit provides frequency upconversion of the signal received from the envelope signal generator circuit 202. In the present example, the double balanced mixer is constructed using CMOS integrated circuits 214, such as MOSFETs. The mixer design shown in FIG. 2 is only one example and does not limit the use of other mixer circuit designs. The output of the mixer circuit 210 is coupled to a transformer 218 and provided to a load 220 as an output signal $v_{out}(t)$.

Figure 3:
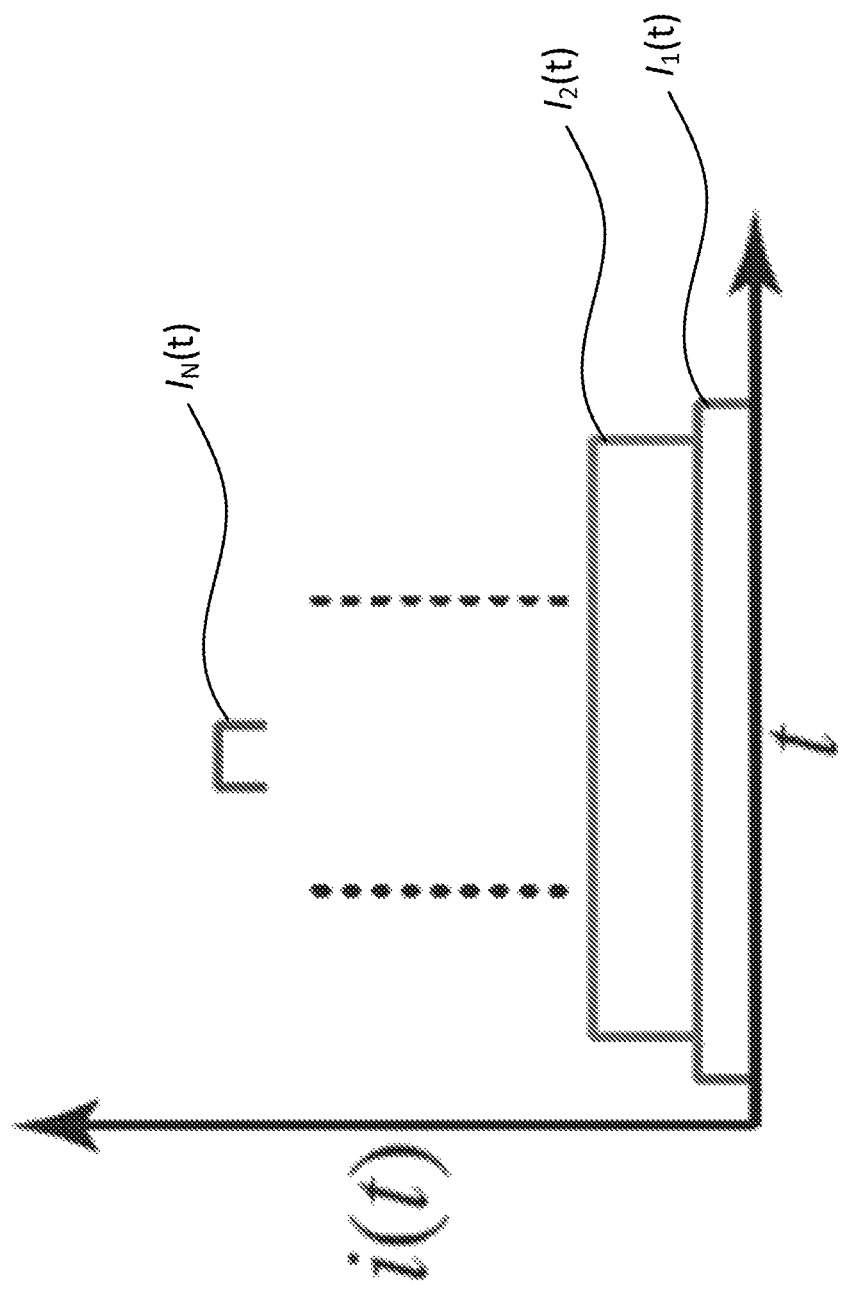
FIG. 3 is a plot illustrating an exemplary signal envelope generation process.

The signal envelope generator circuit 202 can be used to produce various different waveforms, including, but not limited to, symmetric waveforms such as Gaussian and raised cosine waveforms commonly used in quantum computing. In an example signal envelope generation process shown in FIG. 3, each of the current sources 204 is sequentially activated, such that the total current output i(t) steadily increases to a maximum once all the current sources 204 are activated. For instance, a first current source having an output current value of $I_1(t)$ is activated at a first time $t_1$, whereas a second current source having an output current value of $I_2(t)$ is activated at a second time $t_2$ that is later than $t_1$, but while the first current source is still active such that the total current output i(t) is the sum of $I_1(t)$ and $I_2(t)$. The current activation continues in that manner until a last current source having an output current value of $I_N(t)$ is activated at a time $t_N$, such that the total current output i(t) is the sum of all activated current sources. In this simplified example, once all current sources have been activated, they may be deactivated in the reverse order from which they were turned on. The total current output exhibits a staircase-like profile as shown in FIG. 3. As explained herein, the output from the signal envelope generator circuit 202 may be smoothed. Smoothing can be achieved, e.g., using a variable capacitor, such as capacitor 216, though other smoothing techniques may be used instead. In some implementations, the timing for which current sources 204 are activated and turned off is based on a number of clock cycles that have elapsed. For instance, in some cases, the shortest activation time for a current source 204 may be one clock cycle.

Figure 4:
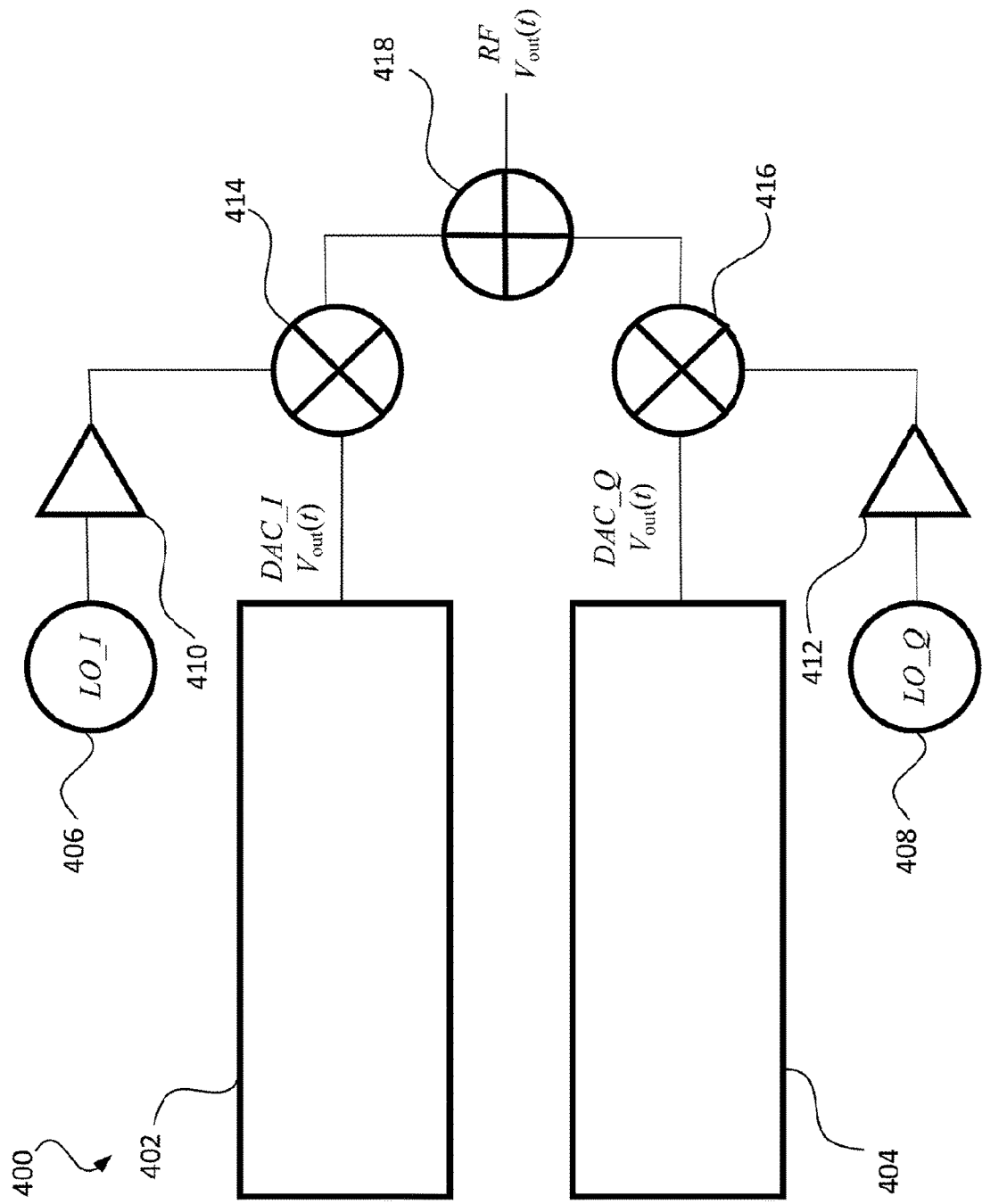
FIG. 4 is a schematic that illustrates an example of a qubit control circuit.

Although the qubit control circuit 200 shown in FIG. 2 includes one signal envelope generator circuit 202 coupled to one mixer circuit 210, in general, a qubit control circuit 200 may include a second identical signal envelope generator circuit coupled to a second mixer circuit. For example, the first and second mixer circuits may be a part of a vector modulator circuit. The outputs of each mixer circuit then may be combined to provide the phase rotation signal. As discussed above, the axis and angle of rotation of the qubit state in the Bloch sphere are determined by the carrier phase and integrated envelope amplitude of the microwave signal, respectively. A simplified schematic of a qubit control circuit illustrating this arrangement is shown in FIG. 4. The qubit control circuit 400 may be used in place of at least a part of the control circuit 10 shown in FIG. 1A. As with circuit 200, qubit control circuit 400 may be implemented as an IC and operated at cryogenic temperatures (e.g., at 3-4 K).

Qubit control circuit 400 includes a first signal envelope generator circuit 402 and a second signal envelope generator circuit 404. Each of first signal envelope generator circuit 402 and second signal envelope generator circuit 404 may be constructed in the same manner as described herein for circuit 202. For instance, each of circuit 402 and 404 may include multiple individual programmable current sources that are tied to a common output or node so as to provide a cumulative current output. Moreover, each of circuit 401 and 404 may include a corresponding smoothing circuit coupled to the respective common node to smooth out the staircase-like appearance of the signal output. Signal envelope generator circuit 402 provides a first output, e.g., DAC_I $v_{out}(t)$, whereas signal envelope generator circuit 404 provides a second output, e.g., DAC_Q $v_{out}(t)$.

Qubit control circuit 400 also includes a first mixer circuit 414 and a second mixer circuit 416. In some implementations, the mixer circuits 414 and 416 are a part of a vector modulator circuit, which includes two mixer circuits and a combiner circuit, where the first and second mixers are driven by sine and cosine waves, respectively. Each of mixer circuits 414, 416 may be constructed as described herein with respect to mixer circuit 210. The first mixer circuit 414 receives the first output DAC_I $v_{out}(t)$ from circuit 402 as an input, whereas the second mixer circuit 416 receives DAC_Q $v_{out}(t)$ from circuit 404 as an input. In addition, each mixer circuit 414, 416 receives a corresponding local oscillator signal. For example, circuit 414 receives a local oscillator signal from oscillator 406, whereas circuit 416 receives a local oscillator signal from oscillator 408. In some implementations, the local oscillators 406, 408 include arbitrary waveform generators that are operated at room temperature and are not a part of the qubit control circuit 400. For example, the local oscillators 406, 408 may be a part of the qubit control circuit 10 shown in FIG. 1. In other implementations, the local oscillators 406, 408 are formed as part of the qubit control circuit 400. In some implementations, the local oscillators 406, 408 provide a periodic waveform, such as a sine or cosine waveform. In some implementations, the first oscillator 406 provides an output signal that is out of phase with the output signal provided by the second oscillator 408. For example, the output signal from the first oscillator 406 may be 90°, 180°, or 270° out of phase with the output signal provided by the second oscillator 408. For example, the output signal from the first oscillator 406 may be a sine wave, whereas the output signal from the second oscillator 408 may be a cosine wave. In some implementations, the oscillator signals are amplified before being passed to the mixer. For example, qubit control circuit 400 includes a first amplifier 410 to amplify the signal from the first oscillator 406, and includes a second amplifier 412 to amplify the signal from the second oscillator 408.

The first mixer 414 mixes the first oscillator output with the first output DAC_I $v_{out}(t)$ from circuit 402, whereas the second mixer 416 mixes the second oscillator output with the second output DAC_Q $v_{out}(t)$ from circuit 404. The outputs of each of the first mixer 414 and the second mixer 416 then are added at an adder circuit 418 to provide a qubit XY drive signal in the form of an RF output.

Figure 5:
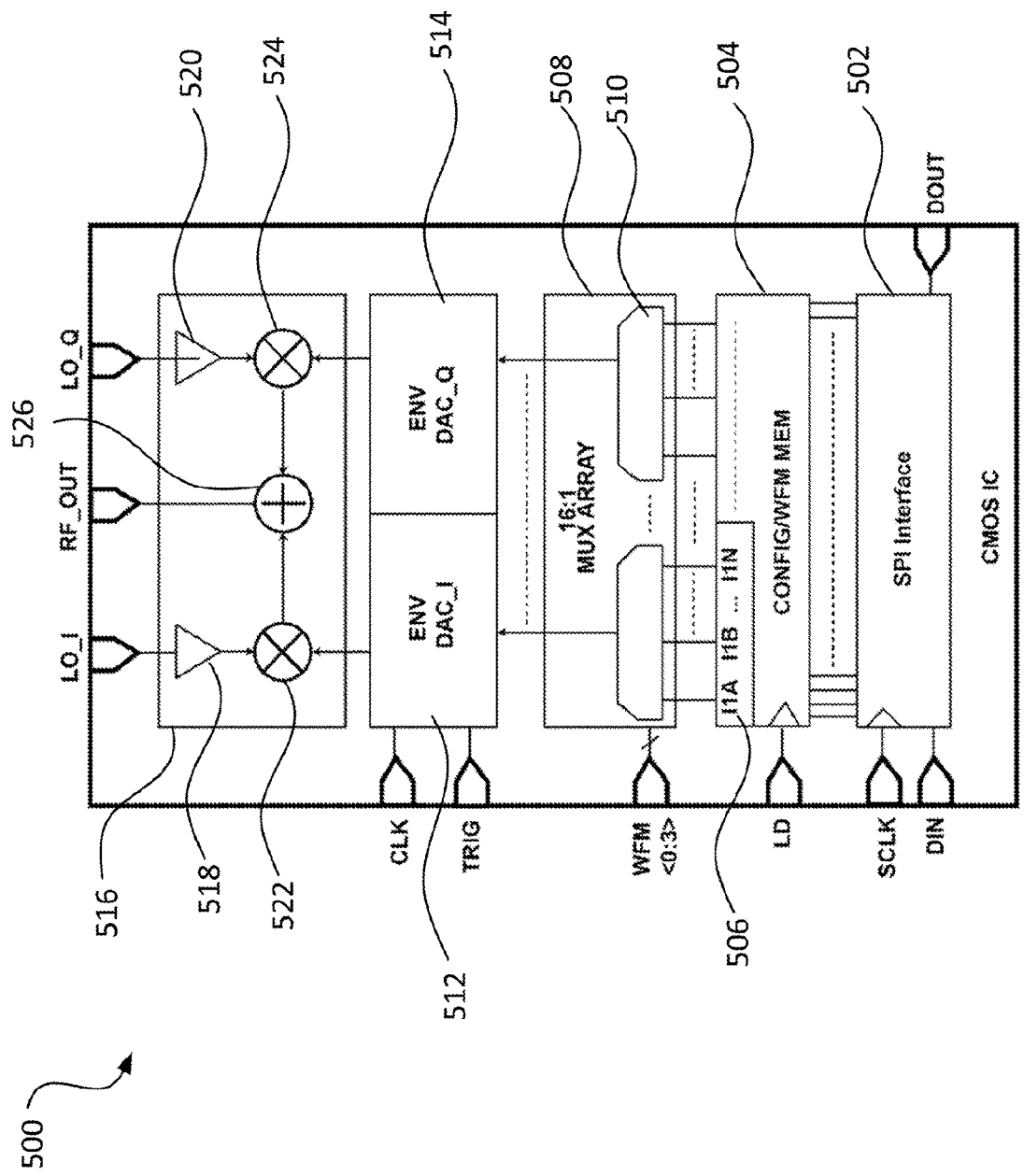
FIG. 5 is a schematic that illustrates an example of a qubit control circuit implemented in an integrated circuit.

FIG. 5 is a schematic that illustrates an example of qubit control circuit, such as qubit control circuit 400, implemented in an integrated circuit 500. The IC 500 may be fabricated using CMOS fabrication techniques. As shown in the example of FIG. 5, the integrated circuit 500 includes a serial-to-parallel interface (SPI) circuit 502 and a configuration/waveform memory 504. Memory 504 can include, e.g., flip-flop based memory or random access memory, among others. During operation of the integrated circuit 500, waveform data is loaded into the SPI circuit 502 and then transferred to parallel registers in the waveform memory 504. Memory 504 allows for multiple different waveforms to be stored, including the individual weightings for each programmable signal source of the signal envelope generators, as well as the weighting for one or more separate reference signal (e.g., current or voltage). The weightings represent magnitudes of currents required for generating a waveform. For example, weightings 506 for a first current source are shown in FIG. 5 as "I1A, I1B . . . I1N" in memory 504. In some implementations, the memory 504 stores 4, 8, 12, 16, 20, 24, 28, or 32 different waveforms for each programmable signal source, although other numbers of waveforms can be stored. The waveforms can have different bit depths. For instance, the waveforms can be programmed to have 4-bits of resolution, 6-bits of resolution, 8-bits of resolution or 10-bits of resolution, though other resolutions are possible as well. Waveform data is provided to the DIN pin of the IC 500. In some implementations, at each cycle of a clock signal provided to SCLK, data may be transferred into the SPI circuit 502. Data may be transferred from the SPI circuit 502 to the parallel registers in memory 504 upon receiving a load signal at the data load pin LD. The SPI circuit 502 itself is updated relatively slowly. For instance, the SPI circuit 502 may be updated according to a clock cycle having a frequency of several kHz. Both the clock signal at SCLK and the data load signal may be provided by room temperature control electronics. Alternatively, in some implementations, the clock and load signals may be generated on the IC 500 itself. In some implementations, there may be an on-chip sequencer to define a series of waveform select signals corresponding to a series of waveforms.

The IC 500 also includes a multiplexer array 508, which includes multiple multiplexers 510. In the present example, each multiplexer 510 is a 16:1 multiplexer, though other multiplexer configurations including, but not limited to, 4:1, 8:1, or 12:1 may be used instead. Waveforms from memory 504 are loaded into multiplexers 510 of a multiplexer. Thus, for instance, in the example of FIG. 5, each multiplexer may receive from memory 504 sixteen different waveforms, from which one is selected based on the waveform select signal received at the WFM input to the IC 500. In the present example, the waveform select signal is a 4-bit signal, allowing selection of up to 16 different waveforms from each multiplexer 510. The waveform select signal may be generated using room temperature control electronics or on the IC 500 itself. In some implementations, the waveform select signal may be generated using an on-chip sequencer.

The output waveform from each multiplexer 510 is coupled to a corresponding programmable signal source. Half of the mux outputs are provided to programmable signal sources in the first signal envelope generator 512, whereas the other half of the mux outputs are provided to programmable signal sources in the second signal envelope generator 514. Thus, if each signal envelope generator includes 11 programmable signal sources (e.g., 11 programmable current sources), then 22 multiplexers 510 are provided overall, with half coupling to corresponding programmable signal sources in generator 512, and the other half coupling to corresponding programmable signal sources in generator 514.

Figure 6:
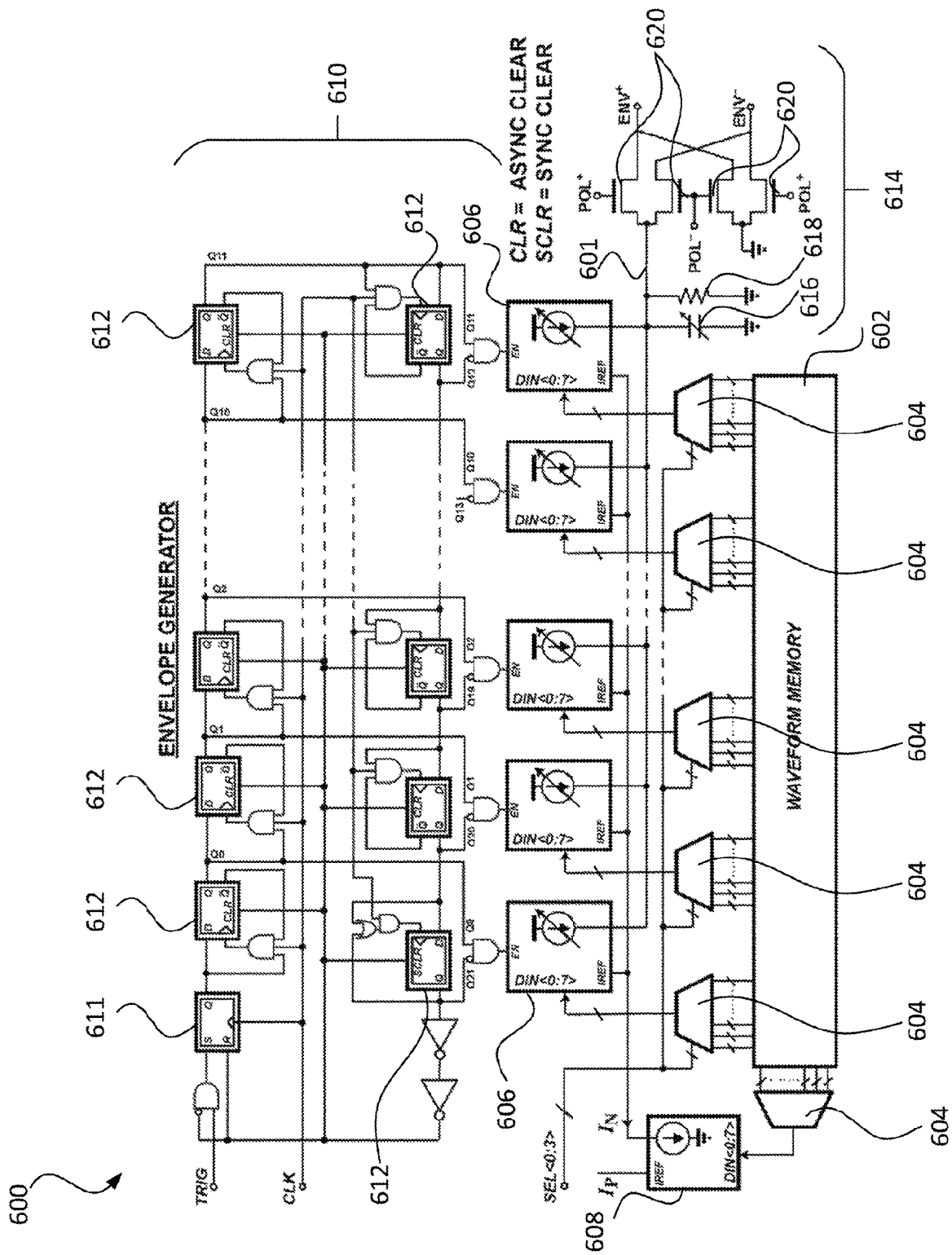
FIG. 6 is a schematic that illustrates a detailed configuration of an exemplary signal envelope generator circuit.

A more detailed schematic of one of the signal envelope generator circuits 512, 514 is provided in FIG. 6. Each signal envelope generator 512, 514 receives a clock signal from the clock pin CLK, and a trigger signal from the trigger pin TRIG. The trigger and clock signals are used to cycle through activation of the programmable signal sources, as described herein with respect FIG. 6. Trigger and clock signals may be provided by room temperature arbitrary waveform generators or may be generated from a source on the IC 500. The outputs of first signal envelope generator circuit 512 and second signal envelope generator circuit 514 are passed to a vector modulator 516. A more detailed schematic of the vector modulator 516 is provided in FIG. 7. Vector modulator 516 includes a first mixer 522 and a second mixer 524, each of which receives a corresponding signal from one of the two signal envelope generator circuits 512, 514. First mixer 522 also receives a first local oscillator signal provided at oscillator pin LO_I, whereas second mixer 524 receives a second local oscillator signal provided at oscillator pin LO_Q. Amplifiers 518 and 520 may be provided for amplifying the received oscillator signals. The vector modulator 516 also includes a summer circuit 526 for summing the outputs of first mixer 522 and second mixer 524. The output from summer circuit 526 is provided to the RF output pin RF_OUT.

Referring to FIG. 6, signal envelope generator circuit 600 includes multiple independent 8-bit digital-to-analog converters (DACs) 606. In the particular example shown in FIG. 6, 11 DACs 606 are provided, though other numbers DACs may be used instead. For example, the signal envelope generator circuit 600 may include, but is not limited to, 3, 4, 5, 6, 7, 8, 9, 10, 12, 13, 14, or 15 DACs. Moreover, the DACs may be configured to have different bit resolution. For example, the DACs 606 may include, but are not limited to, 4-bit, 6-bit, 10-bit or 12-bit DACs. Though the DACs are shown as current mode, voltage-mode DACs may be used instead. The output of each DAC 606 is coupled to a common node 601 so that the total current output of signal envelope generator circuit 600 corresponds to the sum of the current provided by each DAC 606. The total current may be converted to a voltage signal by providing a load 618 (e.g., a resistor) tied to the common node. In some implementations, the combined output signal may be smoothed by providing a capacitor, such as variable capacitor 616, in parallel with the load 618.

Each DAC 606 receives weightings for generating a waveform from a corresponding multiplexer 604. In the present example, the weightings are provided with 8-bit resolution, allowing 256 different current values to be generated by the DAC 606. The current weightings are passed to the multiplexers 604 from the waveform memory 602, which encompasses both the SPI interface circuit 502 and the waveform memory circuit 504 shown in FIG. 5. Waveform memory 602 also may store weightings for a reference DAC 608. Reference DAC 608 generates a reference current $I_N$ that is input to each of the DACs 606. Current $I_P$ is a reference current for the reference current $I_N$ since current is mirrored. Similar to DACs 606, DAC 608 receives the current weightings from a corresponding multiplexer 604 that is coupled to the waveform memory 602. The bit-resolution of the waveform provided to the multiplexer coupled to reference DAC 608 may be the same or different as the bit resolution provided to the other multiplexers. A select signal (SEL) received at the IC tied to each multiplexer 604, thus allowing selection of one of the different waveform weightings input into each multiplexer 604.

A delay circuit 610 is coupled to the DACs 606 and allows the DACs to be activated sequentially. In the present example, the delay circuit 610 is configured so that the DACs produce a symmetric envelope. In particular, the exemplary delay circuit 610 includes a latch RS flip-flop 611, multiple D-type flip-flops 612 and logic gates (e.g., AND gates, OR gates, NOT gates, among others) configured to sequentially activate each DAC 606 and, after all DACs 606 have been activated, to sequentially deactivate each DAC 606 in the reverse order from which they were activated. For instance, upon receiving a trigger signal at TRIG, each of the DACs 606 will be sequentially activated upon each clock cycle of the clock signal provided at CLK until all DACs 606 are activated. Activation of a DAC 606 causes the DAC 606 to output current at the magnitude specified by the weighting received at the DAC 606 from the multiplexer to which the DAC 606 is coupled. Following activation of all DACs 606, the latch 611 is updated such that each DAC 606 is sequentially deactivated. Deactivation causes the DAC 606 to cease current output. The width of the combined current pulse produced by the DACs 606 is a function of the number of DACs used in the present configuration. For instance, in the present example, there are 11 different DACs 606, such that the width of the entire combined current pulse produced by sequential activation and deactivation is 22 clock cycles, with the shortest width of an individual current pulse provided by a single DAC being 1 clock cycle. The configuration shown in FIG. 6 is one example of a delay circuit utilizing flip-flops and logic gates, though other delay circuit configurations using flip-flops and/or logic gates are also possible. While the delay circuit 610 is configured to provide sequential activation and deactivation of the DACs, other DAC activation and deactivation sequences may be used instead. Additionally, in some implementations, the activation and/or deactivation sequence may be stored in memory rather than determined based on the clock signal. For instance, the IC 500 may include a series of different waveforms pre-stored in memory on the chip 500. The circuit 600 also may include a shift register coupled to the select lines to dial in a sequence of waveforms to the DACs 606. The different waveforms may be combined in different sequences depending on the select sequence chosen.

In some implementations, there is a provision such that the combined current signal from the DACs 606 can have its polarity flipped before being passed to the mixer circuit. To cover all four quadrants of an arbitrary carrier phase, the magnitude of each signal from each signal envelope generator circuit should include both a positive and negative wave. In the present example, the polarity flip is achieved using a polarity switch circuit that includes MOSFETs 620. A first pair of the MOSFETs 620 have their sources (or drains) coupled to a common input that receives the combined current output from the DACs 606, whereas the other pair of MOSFETS have their sources (or drains) coupled to a common ground. The gate of one of the MOSFETs 620 in the first pair is controlled by a first control signal (POL+) and the gate of the other one of the MOSFETs 620 in the first pair is controlled by the complement of the first control signal (POL−). The same configuration is applied to the second pair of MOSFETs 620. The polarity switch thus provides a positive envelope wave (ENV+) and a negative envelope wave (ENV−). Other circuit designs are also possible for achieving the polarity flip. In some implementations, differential current may be used instead to provide the positive and negative waves, eliminating the use of the polarity switch circuitry altogether.

Figure 7:
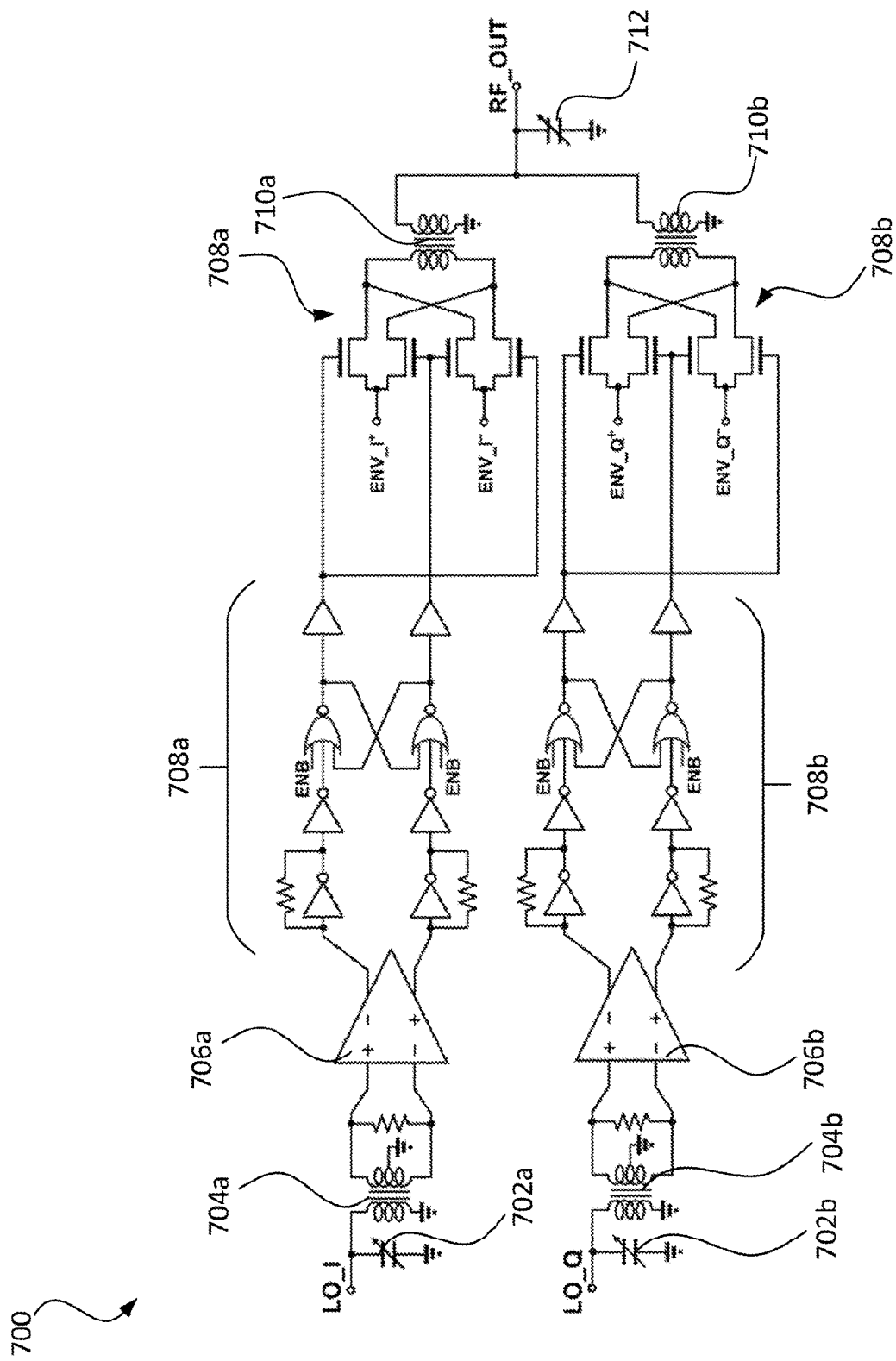
FIG. 7 is a schematic that illustrates a detailed configuration of an exemplary vector modulator circuit.

FIG. 7 is a schematic that illustrates a more detailed configuration of an exemplary vector modulator circuit (e.g., such as vector modulator 516 in FIG. 5). The positive and negative waveforms (also referred to as baseband currents) provided by each signal envelope generator circuit are unconverted using pair of double-balanced passive mixers: first mixer 708a and second mixer 708b, whose differential outputs are transformer-coupled using transformers 710a, 710b and combined into a single-ended signal RF_OUT in the current domain. Variable capacitor 712 allows the center frequency of the transformer to be tuned. In some implementations, an additional DAC may be employed to provide a persistent current to the baseband input of each mixer so as to permit cancellation of LO leakage.

The local oscillator port (LO_I or LO_Q) of each mixer is driven by amplifier chain that provides a tradeoff between power consumption and frequency coverage. Each local oscillator signal is converted from single-ended to differential through a corresponding transformer-based balun (balun 704a and balun 704b) followed by a fully differential gain amplifier (amplifier 706a and amplifier 706b), which serves the purpose of improving common-mode rejection. The differential signals are then amplified using digital blocks 708a, 708b that includes a series of digital gates (e.g., NOT gates and NOR gates), such that the mixer LO ports are driven rail-to-rail. The NOR gate configuration that receives the enable signal ENB prevents more than one signal from being high at the same time. To accommodate the octave bandwidth of operation, tuning capacitors 702 may be incorporated on the local oscillator signal input side of each transformer.

Figure 8:
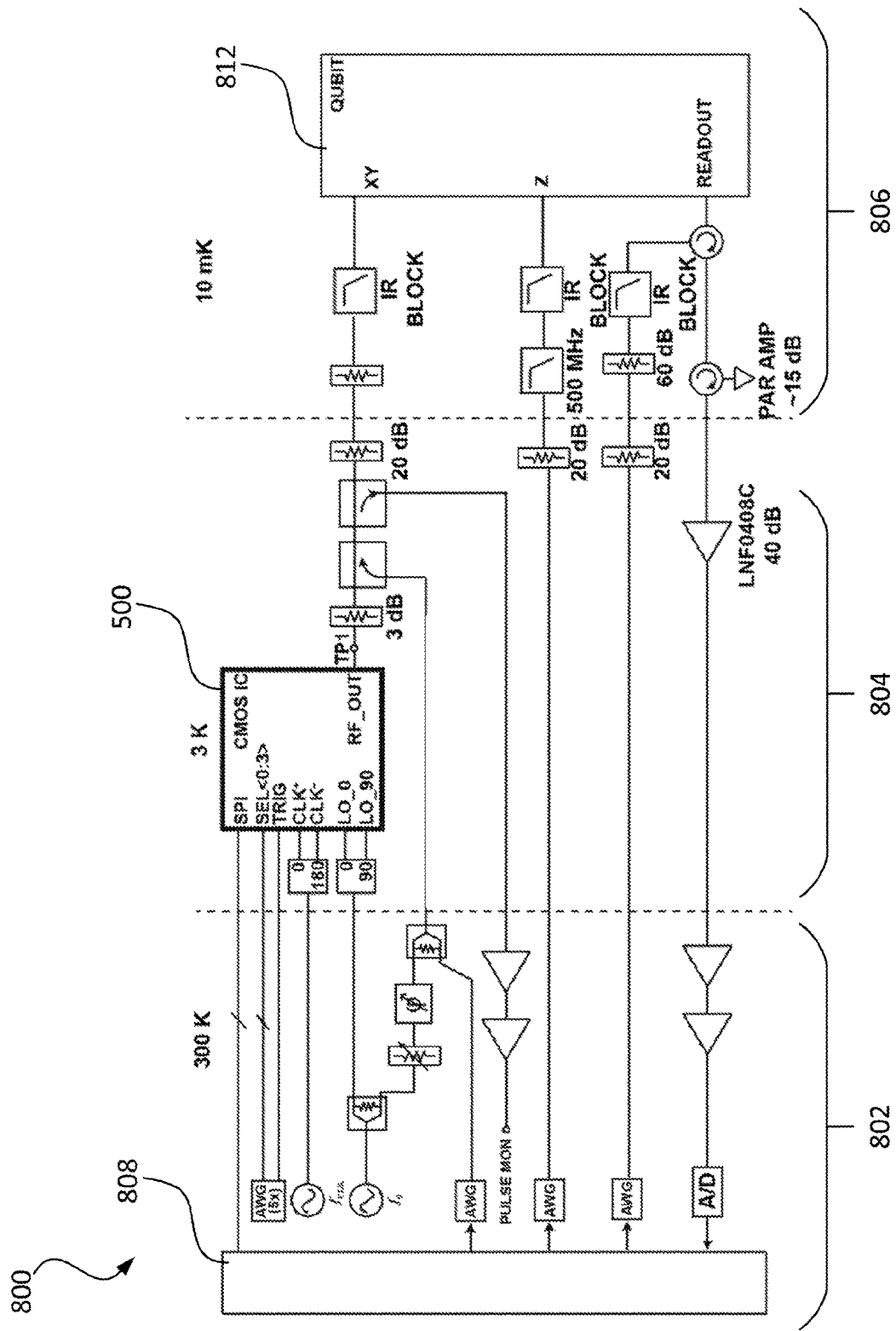
FIG. 8 is a block diagram of an exemplary test setup for a qubit control circuit.

A block diagram of an exemplary test setup 800 in which the IC 500 is used in place of at least a portion of the control electronics 10 from FIG. 1 is shown in FIG. 8. As shown in FIG. 8, the IC 500 is located in an intermediate cooling stage 804 of a dilution refrigerator/cryostat. For instance, the IC 500 may be located in the 3 K intermediate cooling stage. Alternatively, the IC 500 may be positioned in other intermediate cooling stages of the dilution refrigerator/cryostat. Certain control signals and waveforms provided to the IC 500 may be generated at the room temperature stage 802. For example, in some implementations, the data for the SPI interface, the select (SEL) control signal, the trigger (TRIG) control signal, the clock (CLK) signal, and the local oscillator (LO) signal are generated at the room temperature stage 802 from control electronics 808. The control electronics 808 may include multiple different arbitrary waveform generators for generating one or more signals. The control electronics 808 may also generate the Z-drive control signal as well as the readout control signal for driving qubit readout operations. As explained herein, in some implementations, one or more of the signals provided to the IC 500 may instead be generated on the IC 500. The IC 500 is coupled to the qubit chip 812, which is located in the main cooling stage 806 of the dilution refrigerator/cryostat. Each output of the IC 500 may be coupled to a different corresponding qubit XY drive line on the qubit chip 812. In some implementations, various attenuators and filters may be provided on the output lines of the IC 500 to remove noise and to match the power requirements of the qubits.

In some implementations, the LO signal also is split off to drive an auxiliary path that, after passing through amplitude and phase control units, is weakly coupled to the XY signal path following a 3 dB attenuator at the output of the IC 500, allowing for signal leakage to be nulled-out. A secondary use for this auxiliary path permits the qubit XY line to be driven using a room temperature arbitrary waveform generator. In some implementations, a second directional coupler is employed to monitor the RF signal (PULSE MON) propagating down to the qubit chip.

Figure 9:
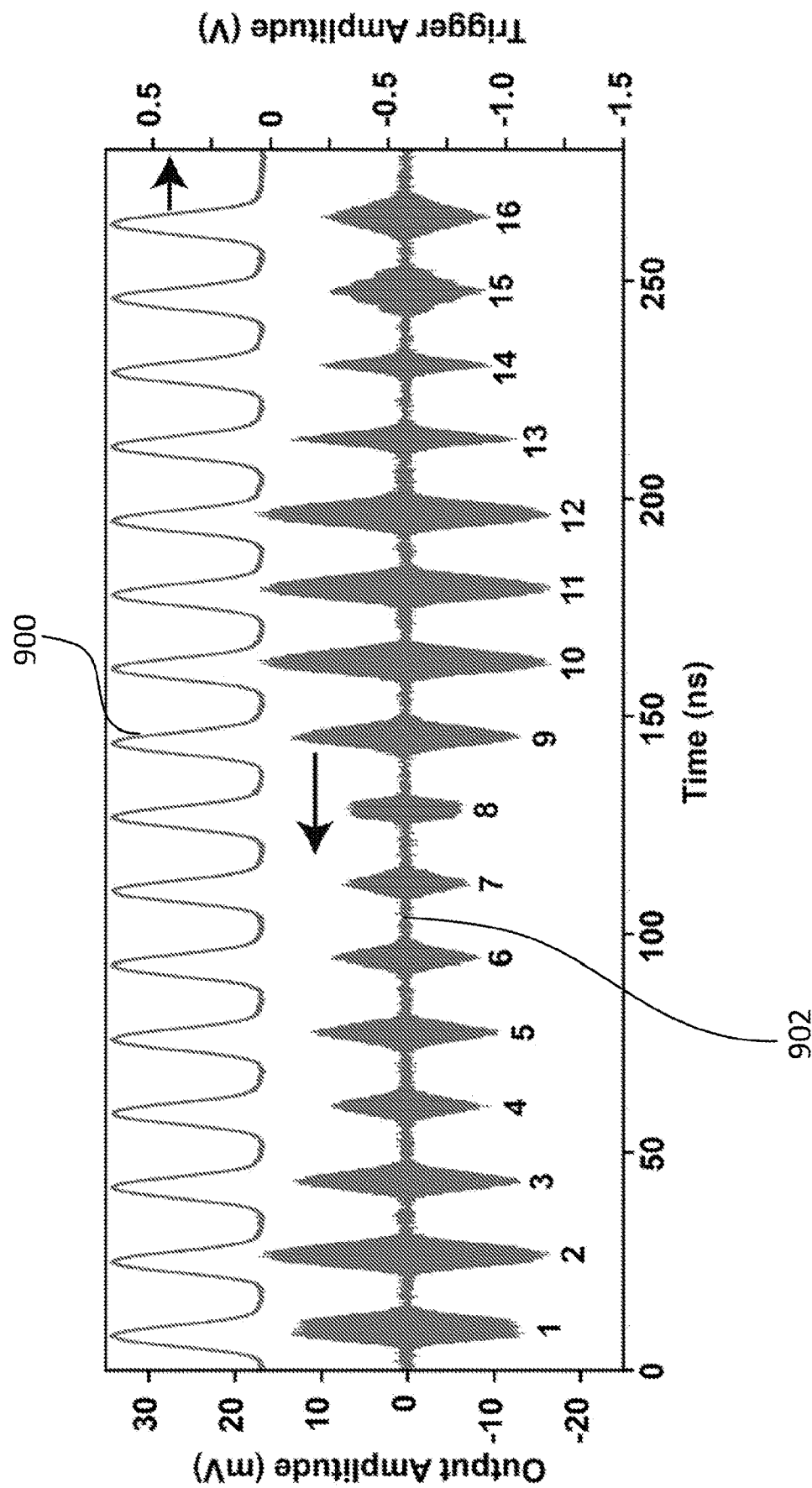
FIG. 9 is a plot that illustrates an example waveform obtained by a test qubit control circuit.

FIG. 9 is a plot that illustrates an example waveform obtained by a test IC having the same configuration as IC 500 shown in FIG. 5 as well as the signal envelope generator circuit configuration and the vector modulator circuit configuration shown in FIGS. 6-7. Waveform 900 corresponds to the trigger signal provided to the IC 500 that initiates activation of the DACs (e.g., DACs 606). Waveform 900 had a frequency period of approximately 18 ns. Waveform 902 corresponds to the RF output obtained from the IC for a carrier frequency of 5.6 GHz. For this measurement, the IC was initialized to output a series of sixteen different waveforms and the control lines were driven to step through all sixteen of the states. The chip was found to be operational for LO frequencies and clock frequencies exceeding the range of 4-8 and 0.5-3 GHz, respectively. At a frequency of 5.5 GHz, the minimum power required to drive the LO port, referenced to the input of the quadrature hybrid, was below −10 dBm. The minimum power required to drive the clock port, referenced to the output of the signal generator, was found to be below −20 dBm.

Figure 10:
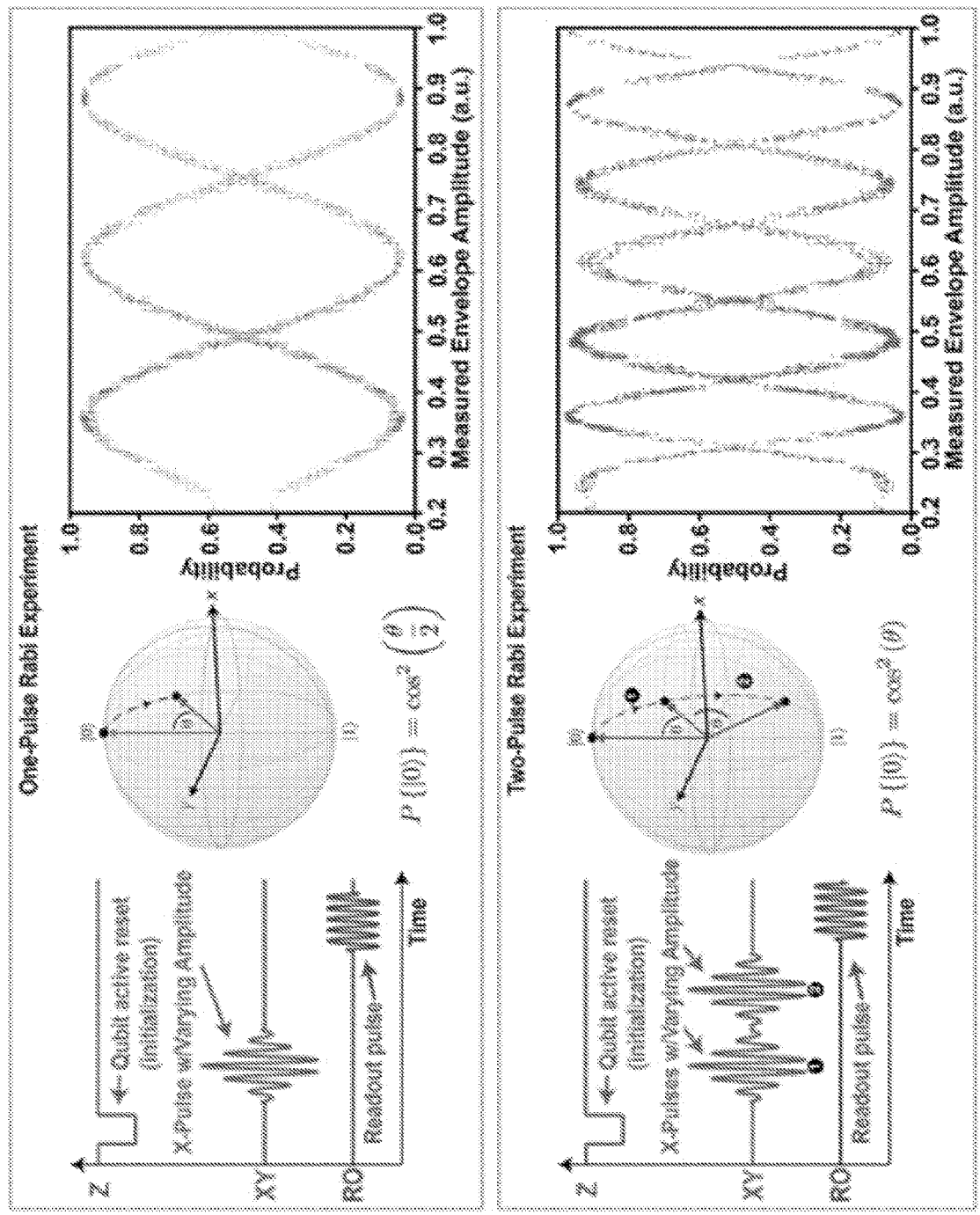
FIG. 10 is a plot illustrating state probabilities obtained by performing a pair of Rabi experiments carried out using qubit control electronics.

After completion of room temperature measurements, the system was cooled down using the test setup 800 shown in FIG. 8. The qubit used in the quantum chip was a frequency tunable transmon qubit. After determining the qubit frequency tuning curves and nominal readout parameters using a standard bringup routine, the qubit was tuned to 5.6 GHz and nominal values for the room temperature attenuator and phase shifter were determined such that |1> state occupation was minimized in the absence of an intentional XY drive. Next, a pair of Rabi experiments were carried out using the CMOS integrated circuit. For these experiments—shown in FIG. 10—the state probabilities were measured as a function of pulse amplitude when the qubit had been initialized and then driven by either one or two pulses of varying amplitude but a fixed duration of 22 ns, corresponding to a 1 GHz clock. These measurements were carried out with the weightings of a single quadrature set to produce a nominally raised cosine envelope and the other set of envelope weightings nulled. The amplitude was varied by sweeping through all 256 states of the DAC reference current ($I_N$). Sweeps were repeated at a total of eleven different values of h. At each point, 5,000 measurements were made to compute the state probabilities. While the state-probabilities would nominally be plotted against the envelope amplitude predicted based upon the digital setting, it was found that the DACs producing $I_N$ were both non-linear and non-monotonic at cryogenic temperatures. As such, a calibration was carried out in which the chip was triggered at 5 MHz and the integrated power in a 190 MHz band centered around 5.6 GHz at the output of the monitor port was measured using a spectrum analyzer to estimate the relative pulse amplitude. The results plotted in FIG. 10 illustrate the anticipated behavior, and the maxima of the |0> and |1> state probabilities are consistent with expectation given the measured readout error rates of 2.4% and 6.8% for the |0> and |1> states, respectively.

The power draw was also measured for each configuration of the Rabi sweep with the chip configured to output pulses continuously. The maximum power consumption was then conservatively estimated as that required to produce a continuous stream of π-pulses. Using this procedure an upper limit on the DC power consumption was estimated to be 1.8 mW from the room temperature 1.05 V supply (due to IR drops along the resistive cryogenic wiring, it is estimated that the supplied voltage at the reference plane of the IC was approximately 950 mV).

Figure 11:
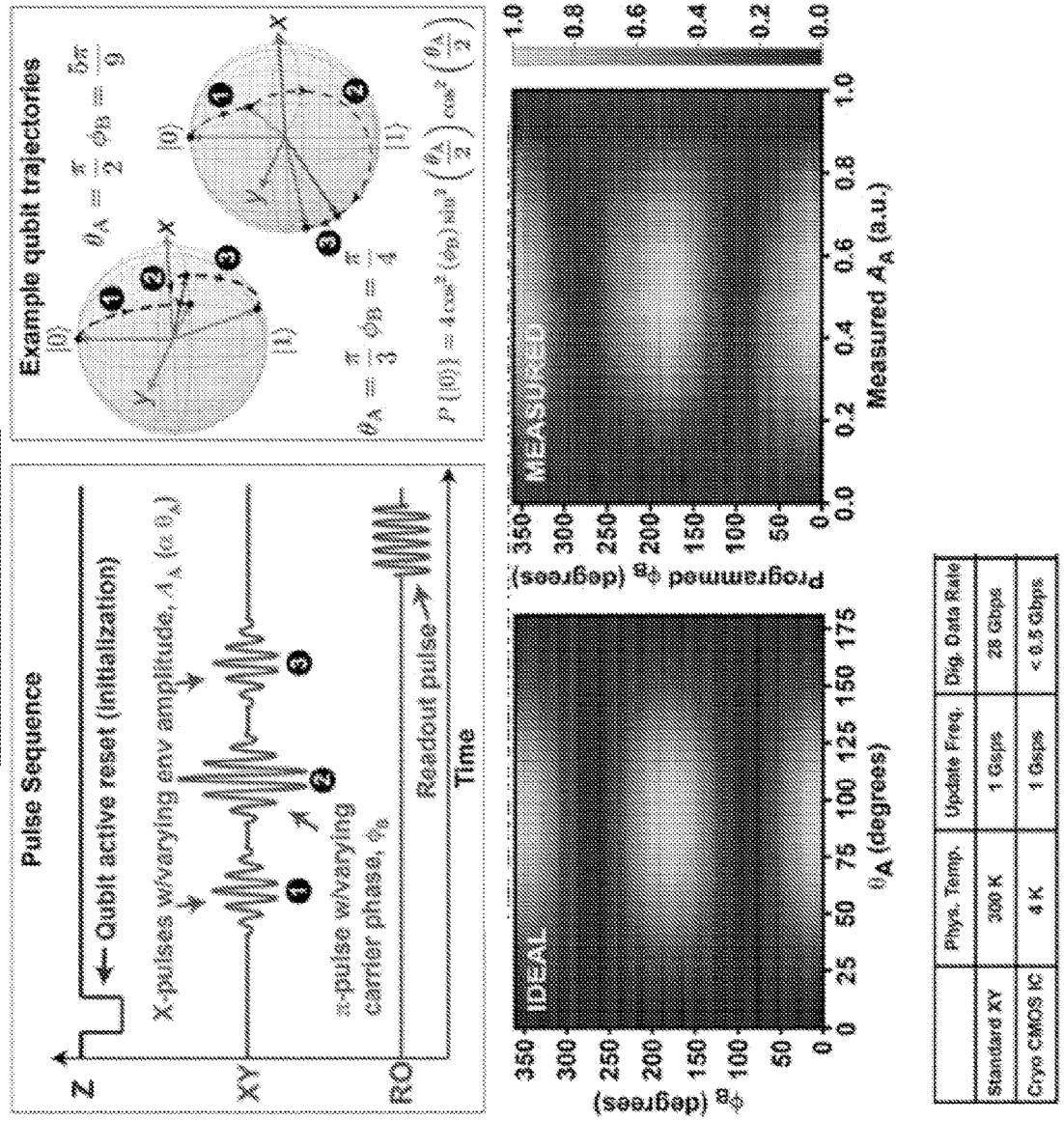
FIG. 11 is a plot illustrating pulse sequence generated by qubit control electronics; example qubit trajectories; and ideal qubit trajectories versus measured qubit trajectories

The feasibility of using the fast-switching and phase-control features of the IC to carry out coherent control of the qubit state was evaluated through an experiment based on three pulses, the protocol of which included (1) initializing the qubit to the |0> state, (2) applying an X-pulse to produce a rotation of $\theta_A$ degrees about the X-axis, (3) applying a π-pulse with carrier phase $\phi_B$ to produce a rotation of πdegrees about a vector at an angle of $\phi B$ from the x-axis in the XY plane, (4) applying a second X-pulse to produce a rotation of $\theta_A$ degrees about the X-axis, and (5) reading out the qubit state (see FIG. 11). This sequence was carried out over a two dimensional sweep for $\phi_B$ in (0, 2π) and of pulse amplitudes AA such that OA was estimated to be in the range of 0 to π. Prior to carrying out this measurement, optimum configuration parameters required to produce a n-pulse were determined as a function of the nominal value of $\phi_B$, based on digital settings. The results appear in FIG. 11 along with baseline measurements taken using standard qubit control electronics. The RMS error between the two is 9.5% and could be improved by further calibration of the CMOS pulse generator. A comparison of the performance of the proposed cryogenic control IC to that of a standard room temperature control system is provided in FIG. 11.

Figure 12:
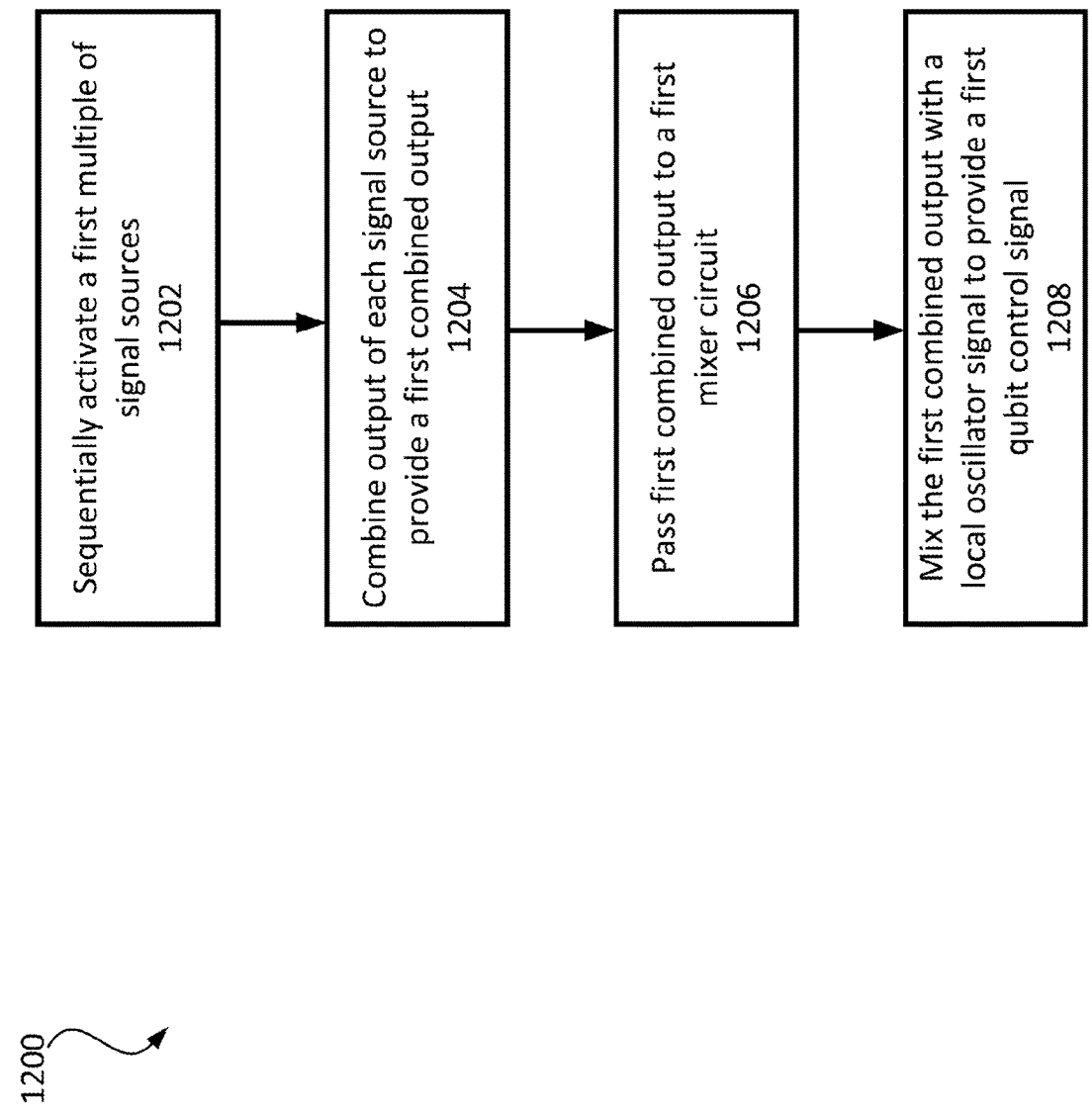
FIG. 12 is a block diagram illustrating an exemplary process for generating a qubit XY control signal.

FIG. 12 is a block diagram illustrating an exemplary process 1200 for generating a qubit XY control signal. The process 1200 may be performed using the qubit control circuits described herein, such as IC 500. In a first step 1202, a first multiple of signal sources are sequentially activated. The signal sources may include current sources or voltage sources as described herein. The output of each signal source is combined (1204) to provide a first combined output. The first combined output is passed (1206) to a first mixer circuit, such as any of the mixer circuits described herein (e.g., mixer circuit 210). The mixer circuit mixes (1208) the first combined output with a local oscillator signal to provide a first qubit control signal. As explained herein, the signal sources may include programmable current sources. The process 1200 also may include sequentially deactivating the first multiple of signal sources. The first combined output also may include a combined output of the sequentially deactivated first multiple of signal sources. The process 1200 also may include smoothing the first combined output prior to passing the first combined output to a first mixer. The process 1200 also may include: sequentially activating a second multiple of signal sources; combining an output of the sequentially activated second multiple of signal sources to provide a second combined output; passing the second combined output to a second mixer circuit; mixing the second combined output with a second local oscillator signal in the second mixer circuit to provide a second qubit control signal; and combining the first qubit control signal with the second qubit control signal to provide a qubit XY control signal. The qubit XY control signal then may be coupled to a qubit on a qubit chip, such as chip 100 or chip 812. The first local oscillator signal may be out of phase with the second local oscillator signal. For example, the first oscillator signal may be a sine wave, whereas the second local oscillator signal may be a cosine wave. The process 1200 may be performed at a temperature of above 10 mK (e.g., above 100 mK) and below 40 K.

The discussion of the exemplary control circuit presented herein pertains to using the integrated circuit to implement single qubit gates. However, the control circuit may also be used to implement multiple qubit gates.

Implementations of the quantum subject matter and quantum operations described in this specification can be implemented in suitable quantum circuitry or, more generally, quantum computational systems, also referred to as quantum information processing systems, including the structures disclosed in this specification and their structural equivalents, or in combinations of one or more of them. The terms "quantum computational systems" and "quantum information processing systems" may include, but are not limited to, quantum computers, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of about 1.2 kelvin), indium (superconducting critical temperature of about 3.4 kelvin), NbTi (superconducting critical temperature of about 10 kelvin) and niobium (superconducting critical temperature of about 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of embodiments of the invention have been described. Nevertheless, it will be understood that various modifications may be made without departing from the spirit and scope of the invention. Accordingly, other embodiments are within the scope of the following claims.

What is claimed is:

1. A device for generating a qubit control signal, the device comprising:
   a first signal envelope generator circuit comprising a first plurality of signal sources, wherein an output of each signal source of the first plurality of signal sources is combined to provide a first cumulative output; and
   a first mixer circuit coupled to the first signal envelope generator circuit, wherein the first cumulative output is coupled to a first input of the first mixer circuit, and an output of the first mixer circuit comprises a first qubit control signal.

2. The device of claim 1, wherein the first plurality of signal sources comprises a plurality of current sources.

3. The device of claim 2, wherein the plurality of current sources comprise programmable current sources.

4. The device of claim 2, wherein the output of each signal source is tied to a common node.

5. The device of claim 1, wherein the first signal envelope generator circuit comprises a variable capacitor coupled to the first cumulative output.

6. The device of claim 1, wherein the first signal envelope generator circuit comprises a delay circuit coupled to the first plurality of signal sources.

7. The device of claim 6, wherein the delay circuit comprises a plurality of flip-flops configured to cause sequential activation and deactivation of the first plurality of signal sources.

8. The device of claim 1, wherein the first mixer circuit comprises a double balanced mixer circuit.

9. The device of claim 8, wherein the double balanced mixer circuit comprises a plurality of MOSFETS.

10. The device of claim 1, wherein the first mixer circuit is configured to mix the first cumulative output with a local oscillator signal received at a second input of the first mixer circuit.

11. The device of claim 1, further comprising memory.

12. The device of claim 11, further comprising a multiplexer array coupled to the memory and to the first signal envelope generator circuit.

13. The device of claim 1, further comprising:
   a second signal envelope generator circuit comprising a second plurality of signal sources, wherein an output of each signal source of the second plurality of signal sources is combined to provide a second cumulative output; and
   a second mixer circuit, wherein the second cumulative output is coupled to a first input of the second mixer circuit, an output of the second mixer circuit comprises a second qubit control signal, and the first qubit control signal is combined with the second qubit control signal to provide a qubit XY control signal.

14. The device of claim 13, wherein the first mixer circuit is configured to mix the first cumulative output with a first local oscillator signal received at a second input of the first mixer circuit and the second mixer circuit is configured to mix the second cumulative output with a second local oscillator signal received at a second input of the second mixer circuit.

15. The device of claim 14, wherein the first local oscillator signal is out of phase with the second local oscillator signal.

16. The device of claim 15, wherein the first local oscillator signal is out of phase with the second local oscillator signal by any one of 90°, 180°, or 270°.

17. The device of claim 1, wherein the device is an integrated circuit.

18. A method for generating a qubit control signal, the method comprising:
sequentially activating a first plurality of signal sources;
combining an output of the sequentially activated first plurality of signal sources to provide a first combined output;
passing the first combined output to a first mixer circuit; and
mixing the first combined output with a first local oscillator signal in the first mixer circuit to provide a first qubit control signal.

19. The method of claim 18, wherein the first plurality of signal sources comprises a first plurality of current sources.

20. The method of claim 19, wherein the first plurality of current sources are programmable current sources.

21. The method of claim 18, comprising sequentially deactivating the first plurality of signal sources.

22. The method of claim 21, wherein the first combined output comprises a combined output of the sequentially deactivated first plurality of signal sources.

23. The method of claim 18, further comprising smoothing the first combined output prior to passing the first combined output to the first mixer circuit.

24. The method of claim 18, further comprising:
sequentially activating a second plurality of signal sources;
combining an output of the sequentially activated second plurality of signal sources to provide a second combined output;
passing the second combined output to a second mixer circuit;
mixing the second combined output with a second local oscillator signal in the second mixer circuit to provide a second qubit control signal; and
combining the first qubit control signal with the second qubit control signal to provide a qubit XY control signal.

25. The method of claim 24, wherein the first local oscillator signal is out of phase with the second local oscillator signal.

26. The method of claim 18, comprising performing the method at a temperature of above 10 mK and below 40 K.

* * * * *